United States Patent
Zhang et al.

(10) Patent No.: US 9,620,578 B2
(45) Date of Patent: Apr. 11, 2017

(54) ARRAY SUBSTRATE, MANUFACTURE METHOD THEREOF, AND DISPLAY PANEL

(71) Applicants: BOE TECHNOLOGY GROUP CO., LTD., Beijing (CN); BEIJING BOE OPTOELECTONICS TECHNOLOGY CO., LTD., Beijing (CN)

(72) Inventors: Jiaxiang Zhang, Beijing (CN); Jian Guo, Beijing (CN); Xu Chen, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/436,517

(22) PCT Filed: Aug. 29, 2014

(86) PCT No.: PCT/CN2014/085498
§ 371 (c)(1),
(2) Date: Apr. 17, 2015

(87) PCT Pub. No.: WO2015/143836
PCT Pub. Date: Oct. 1, 2015

(65) Prior Publication Data
US 2015/0380476 A1    Dec. 31, 2015

(30) Foreign Application Priority Data
Mar. 28, 2014 (CN) .......................... 2014 1 0130738

(51) Int. Cl.
*H01L 27/32* (2006.01)
*H01L 29/417* (2006.01)
(Continued)

(52) U.S. Cl.
CPC .......... *H01L 27/3276* (2013.01); *H01L 27/12* (2013.01); *H01L 27/3227* (2013.01);
(Continued)

(58) Field of Classification Search
CPC ............... H01L 27/3227; H01L 31/028; H01L 27/3262; H01L 27/3258; H01L 27/3276;
(Continued)

(56) References Cited

U.S. PATENT DOCUMENTS

2002/0008796 A1* 1/2002 Kung .................. G02F 1/13318
                                                              349/42
2005/0017302 A1* 1/2005 Hoffman ............... H01L 29/105
                                                              257/347
(Continued)

FOREIGN PATENT DOCUMENTS

| CN | 102117825 A | 7/2011 |
|---|---|---|
| CN | 103928474 A | 7/2014 |
| CN | 203760477 U | 8/2014 |

OTHER PUBLICATIONS

Dec. 31, 2014—(WO)—International Search Report and Written Opinion PCT/CN2014/085498 English Tran.
(Continued)

*Primary Examiner* — Caridad Everhart
(74) *Attorney, Agent, or Firm* — Banner & Witcoff, Ltd.

(57) ABSTRACT

An array substrate, a manufacture method of the array substrate, and a display panel are configured to achieve a combination of solar energy technology and the OLED display technology. The array substrate includes substrate, scanning lines, data lines, a thin film transistor (TFT), a common electrode and a pixel electrode. The array substrate further includes a light-emitting structure configured to provide a backlight source, a solar cell structure and a power output line. The light-emitting structure is provided between
(Continued)

the common electrode and the pixel electrode. The solar cell structure is provided between the substrate and the common electrode. The power output line is provided in a same layer as the common electrode and is electrically connected to the solar cell structure so as to transmit electric energy generated by the solar cell structure to an external circuit.

15 Claims, 8 Drawing Sheets

(51) Int. Cl.
*H01L 31/028* (2006.01)
*H01L 31/075* (2012.01)
*H01L 51/56* (2006.01)
*H01L 27/12* (2006.01)
*H01L 31/18* (2006.01)

(52) U.S. Cl.
CPC ...... *H01L 27/3258* (2013.01); *H01L 27/3262* (2013.01); *H01L 29/41733* (2013.01); *H01L 31/028* (2013.01); *H01L 31/075* (2013.01); *H01L 31/1804* (2013.01); *H01L 51/56* (2013.01); *H01L 2227/323* (2013.01)

(58) Field of Classification Search
CPC ........... H01L 29/41733; H01L 31/1804; H01L 31/075; H01L 51/56; H01L 2227/323
USPC .......................................................... 438/19
See application file for complete search history.

(56) References Cited

U.S. PATENT DOCUMENTS

| | | | |
|---|---|---|---|
| 2009/0108757 A1 | 4/2009 | Lee et al. | |
| 2011/0317121 A1* | 12/2011 | Lin | G02F 1/133512 349/158 |
| 2012/0013833 A1* | 1/2012 | Chang | G02F 1/133 349/122 |
| 2012/0326131 A1* | 12/2012 | Han | H01L 51/5215 257/40 |
| 2013/0187161 A1* | 7/2013 | Yamazaki | H01L 29/786 257/57 |
| 2014/0295179 A1* | 10/2014 | Naito | B82Y 10/00 428/339 |

OTHER PUBLICATIONS

May 13, 2016—(CN)—Second Office Action Appn 201410130738.X with English Tran.
Feb. 1, 2016—(CN) Office Action—App 201410130738.X—Eng Tran.

* cited by examiner

ARRAY SUBSTRATE, MANUFACTURE METHOD THEREOF, AND DISPLAY PANEL

The application is a U.S. National Phase Entry of International Application No. PCT/CN2014/085498 filed on Aug. 29, 2014, designating the United States of America and claiming priority to Chinese Patent Application No. 201410130738.X filed on Mar. 28, 2014. The present application claims priority to and the benefit of the above-identified applications and the above-identified applications are incorporated by reference herein in their entirety.

TECHNICAL FIELD

Embodiments of the present disclosure relate to an array substrate, a manufacture method of the same, and a display panel.

BACKGROUND

Compared with Liquid Crystal Display (LCD) device, an Organic Light-Emitting-Diode (OLED) display device doesn't require a backlight module but is manufactured by utilizing extremely thin light-emitting structure and glass substrate. Generally, the light-emitting structure of the OLED includes a light-emitting material layer, an electron transport layer and a hole transport layer; wherein the electron transport layer and the hole transport layer are disposed at an upper side and a lower side of the light-emitting material layer, respectively; the light-emitting structure will emit light when there is electrical current passing through the light-emitting material layer. The OLED display device omits the backlight module and hence can be made lighter and thinner with broader viewing angle and it can save energy significantly. Therefore, the OLED display device is increasingly widespread in the field of display.

At the same time, with development of photovoltaic technology, solar cell has been world-widely approved in terms of its application and development for advantages that it is not restricted to resource condition, no environment pollution, capable of emitting light even with a weak light source, and that it has excellent light transmittance, long duration for power generation, short industry chain, low cost, fast recycle and is less-influenced by temperature change with wide application ranges.

SUMMARY

At least one embodiment of the present disclosure provides an array substrate, the array substrate comprises: a substrate; scanning lines and data lines arranged in an intersecting manner on the substrate; pixel units defined by the data lines and the data lines and arranged in matrix, each of the pixel units is provided with a thin film transistor (TFT), a common electrode and a pixel electrode therein, wherein the TFT comprises a gate, a gate insulating layer, an active layer, a source electrode and a drain electrode; and a light-emitting structure configured to provide a backlight source, a solar cell structure and a power output line; wherein the light-emitting structure is provided between the common electrode and the pixel electrode, the solar cell structure is provided between the substrate and the common electrode, the power output line is provided in a same layer as the common electrode and is electrically connected to the solar cell structure so as to transmit electric energy generated by the solar cell structure to an external circuit.

In an example, the light-emitting structure comprises: an anode and a cathode provided oppositely to each other; and a light-emitting material layer provided between the anode and the cathode; wherein a common electrode located below the light-emitting structure serves as the cathode.

In an example, the TFT is a bottom gate TFT; the gate is provided in a same layer as the solar cell structure; the gate insulating layer is located over the layer of the gate and the solar cell structure to cover the gate and the solar cell structure.

In an example, the array substrate further comprises a barrier layer provided over the active layer and below the layer of the source electrode and the drain electrode.

In an example, the barrier layer is provided with a first via hole and a second via hole at locations corresponding to the source electrode and the drain electrode, respectively; wherein the source electrode is electrically connected to the active layer through the first via hole, and the drain electrode is electrically connected to the active layer through the second via hole.

The barrier layer and the gate insulating layer are provided with a third via hole at locations corresponding to the power output line, and the positive electrode is electrically connected to the power output line through the third via hole.

In an example, the TFT is a top gate TFT; wherein the active layer is provided in a same layer as the solar cell structure.

In an example, the array substrate further comprises a barrier layer provided over the source electrode and the drain electrode and below the active layer.

In an example, the barrier layer is provided with a first via hole and a second via hole at locations corresponding to the source electrode and the drain electrode, respectively; wherein the source electrode is electrically connected to the active layer through the first via hole, and the drain electrode is electrically connected to the active layer through the second via hole.

The barrier layer is provided with a fourth via hole at a location corresponding to the power output line, and the positive electrode is electrically connected to the power output line through the fourth via hole.

In an example, the array substrate further comprises a passivation layer located over the TFT.

At least one embodiment of the present disclosure also provides a display panel comprising the above array substrate.

At least one embodiment of the present disclosure further provides a manufacture method of array substrate, comprising: a step of forming scanning lines, data lines, common electrode, pixel electrode and thin film transistor (TFT), wherein the TFT comprises a gate electrode, a gate insulating layer, a source electrode, a drain electrode and an active layer, the common electrode, the pixel electrode and the TFT are all formed in a plurality of pixel regions defined by the scanning lines and the data lines; and a step of forming a light-emitting structure, a solar cell structure and a power output line on a substrate; wherein, the light-emitting structure is provided between the common electrode and the pixel electrode; the solar cell structure is provided between the array substrate and the common electrode; and the power output line is provided in a same layer as the common electrode and is electrically connected to the solar cell structure so as to transmit electric power generated by the solar cell structure to an external circuit.

In an example, the light-emitting structure comprises: an anode and a cathode provided oppositely to each other; and a light-emitting material layer provided between the anode and the cathode; wherein a common electrode located below the light-emitting structure serves as the cathode.

In an example, during forming the TFT, forming a pattern comprising the gate over the substrate, the gate is provided in a same layer as the solar cell structure; forming the gate insulating layer over the pattern comprising the gate to completely cover the gate and the solar cell structure; forming a pattern comprising the active layer over the gate insulating layer; and forming the source electrode and the drain electrode over the pattern comprising the active layer, wherein the source electrode and the drain electrode are provided in a same layer.

In an example, the method further comprises: forming a pattern comprising a barrier layer over the pattern comprising the active layer; the barrier layer is located below the layer of the source electrode and the drain electrode.

In an example, during forming the TFT, forming a pattern comprising the source electrode and the drain electrode over the substrate, the source electrode and the drain electrode are provided in a same layer; forming a pattern comprising the active layer over the pattern comprising the source electrode and the drain electrode, the active layer is located below the gate insulating layer; forming the gate insulating layer over the pattern comprising the active layer, the gate insulating layer is located below the gate; and forming a pattern comprising the gate over the gate insulating layer.

In an example, the method further comprises: forming a pattern comprising a barrier layer over the pattern comprising the gate, the barrier layer is located over the layer of the source electrode and the drain electrode and below the active layer.

In an example, the method further comprises: forming a passivation layer over the TFT.

DETAILED DESCRIPTION

Figure 1:
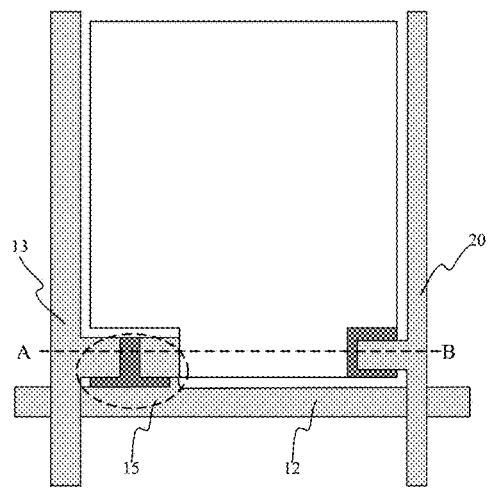
FIG. 1 illustrates a planar schematic structural view of an array substrate as provided by a first embodiment of the present disclosure.

The technical solutions according to the embodiments of the present disclosure will be described clearly and completely as below in conjunction with the accompanying drawings of embodiments of the present disclosure. It is to be understood that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly. The applicant realized that a light transmittance of LC panel in the array substrate shown in FIG. 1 and FIG. 2 is not quite large due to the same voltage of common electrodes in the array substrate.

In the OLED display device powered by a solar cell, the solar cell and the OLED display portion usually are two separate parts, so the manufacture process of the solar cell is independent from that of the OLED display device. The manufacture process of the OLED display device and the manufacture process of the solar cell both require multiple patterning processes, which result in the manufacture method of the OLED display device powered by the solar cell relatively complicated. Furthermore, the production cost of the OLED display device powered by the solar cell also rises with the increased number of the patterning processes.

Embodiments of the present disclosure provide an array substrate, a manufacture method of the same and a display device which are configured to combine the manufacture process of solar cell structure with the manufacture process of OLED, so as to achieve the combination of solar energy technology and OLED display technology to solve the technical problem that the conventional manufacture method is complicated with relatively higher production cost due to separately arranged solar cell structure and OLED structure.

Figure 2:
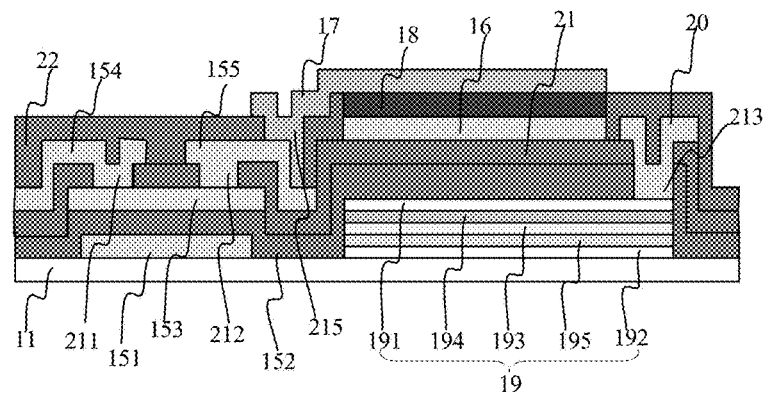
FIG. 2 illustrates a schematic structural section-view of the array substrate taken along a direction of dotted line A-B in FIG. 1.

The array substrate as provided by a first embodiment of the present disclosure is shown in FIG. 1 and FIG. 2. FIG. 1 illustrates a planar schematic structural view of the array substrate as provided by the first embodiment of the present disclosure; FIG. 2 illustrates a schematic structural section-view of the array substrate taken along a direction of dotted line A-B in FIG. 1. As illustrated in FIG. 1 and FIG. 2, the array substrate includes: a substrate 11; scanning lines 12 and data lines 13 arranged in an intersecting manner on the substrate 11; and pixel units defined by the scanning lines 12 and the data lines 13 and arranged in matrix. The pixel unit is provided with a TFT 15, a common electrode 16 and a pixel electrode 17 therein. The TFT 15 includes a gate 151, a gate insulating layer 152, an active layer 153, a source electrode 154 and a drain electrode 155. The array substrate further includes a light-emitting structure 18 configured to provide a backlight source, a solar cell structure 19 and a power output line 20. The light-emitting structure 18 is disposed between the common electrode 16 and the pixel electrode 17. The solar cell structure 19 is disposed between the substrate 11 and the common electrode 16. The power output line 20 is disposed in a same layer as the common electrode 16 and is electrically connected to the solar cell structure 19 so as to transmit electric energy generated by the solar cell structure 19 to an external circuit. The power output line 20 and the common electrode 16 are disposed in the same layer, and hence can be formed through a single patterning process, which facilitates the manufacture process and reduces the production cost.

Figure 3:
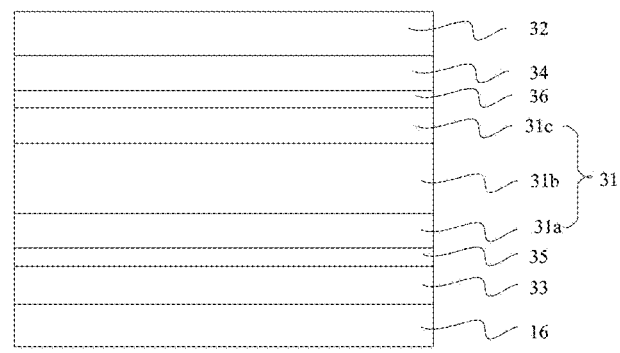
FIG. 3 illustrates a schematic structural section-view of a light-emitting structure.

Referring to FIG. 3, the light-emitting structure 18 includes: an anode 32 and a cathode disposed oppositely to each other; and a light-emitting material layer 31 disposed between the anode 32 and the cathode. The common electrode 16 located below the light-emitting structure serves as the cathode. The common electrode 16 is located below the light-emitting structure 18 and serves as the cathode of the light-emitting structure 18 so as to facilitate to decrease the manufacture processes and reduce the production cost. The anode 32 together with the common electrode 16 serving as the cathode of the light-emitting structure 18 is configured to supply the light-emitting structure with a driving voltage, which allows the light-emitting structure to generate white light.

Besides, the light-emitting structure 18 further includes: an electron transport layer 33, a hole transport layer 34, a first barrier layer 35 and a second barrier layer 36.

The electron transport layer 33 is located between the common electrode 16 and the light-emitting material layer 31, and is configured to introduce electrons into the light-emitting material layer 31.

The hole transport layer 34 is located between the light-emitting material layer 31 and the anode 32, and is configured to introduce holes into the light-emitting material layer 31.

The first barrier layer 35 is located between the electron transport layer 33 and the light-emitting material layer 31, and is configured to block holes to be transported to the common electrode 16.

The second barrier layer 36 is located between the hole transport layer 34 and the light-emitting material layer 31, and is configured to block electrons to be transported to the anode 32.

The light-emitting material layer 31 includes: an orange phosphorescent layer 31a located over the first barrier layer 35, a blue fluorescence layer 31b located over the orange phosphorescent layer 31a, and a green phosphorescent layer 31c located over the blue fluorescence layer 31b.

During operation of the light-emitting structure 18, electrons are injected at the common electrode 16 and introduced into the light-emitting material layer 31 through the electron transport layer 33, and holes are injected at the anode 32 and introduced into the light-emitting material layer 31 through the hole transport layer 34; and then the electrons and the holes are recombined in the light-emitting material layer 31 to form singlet state excitons and triplet state excitons. During transition from excitation state to ground state, the singlet state excitons and the triplet state excitons release their energy in form of photons and thermal energy in which part of the photons are utilized as a backlight source configured to provide light for image display. The transition from excitation state to ground state of the singlet state excitons in the blue fluorescence layer 31b allows emitting blue fluorescence, and the transition from ground state to excitation state of the triplet state excitons in the orange phosphorescent layer 31a and green phosphorescent layer 31c allows emitting green fluorescence and orange fluorescence; the blue fluorescence is recombined with the green phosphorescent and orange phosphorescent so as to form the white light.

The solar cell structure 19 includes: a positive electrode 191 and a negative electrode 192 disposed oppositely to each other; an intrinsic silicon material layer 193 disposed between the positive electrode 191 and the negative electrode 192; a P-type silicon material layer 194 disposed between the positive electrode 191 and the intrinsic silicon material layer 193; and a N-type silicon material layer 195 disposed between the negative electrode 192 and the intrinsic silicon material layer 193.

In the solar cell structure 19, the P-type silicon material layer 194 and the N-type silicon material layer 195 form a PN junction. When the solar cell structure 19 is subjected to irradiation, in the PN junction, holes of the N-type silicon material layer 195 transfer to the P-type silicon material layer 194, while electrons of the P-type silicon material layer 194 transfer to the N-type silicon material layer 195, so as to form electric current flow from the N-type silicon material layer 195 to the P-type silicon material layer 194, and then from electrical potential in the PN junction which is connected to an external circuit through the positive electrode 191 and the negative electrode 192 to form a loop.

The TFT 15 is a bottom gate TFT.

The gate 151 of the bottom gate TFT is disposed in a same layer as the scanning lines 12, both of them are located over the substrate 11; and the scanning lines 12 are configured to provide the gate 151 with scanning signals. The gate 151 is made of a same material as the scanning line 12. The material as used for manufacture typically is nontransparent metal including chromium (Cr), tungsten (W), titanium (Ti), molybdenum (Mo), aluminum (Al) and copper (Cu) or the like, or an alloy thereof.

The gate insulating layer 152 is located over the layer of the gate 151 and the scanning lines 12 to cover the area over the gate 151 and the scanning lines 12, and is configured to insulate the gate 151 and the scanning lines 12 from other layers. The gate insulating layer is formed of transparent insulating material, such as silicon oxide or silicon nitride, or the like.

The active layer 153 is located over the gate insulating layer 152, and is formed of indium gallium zinc oxide (IGZO) or other transition metal oxide. The active layer 153 can also be formed of amorphous silicon material or polycrystalline silicon material. However, in an example of the embodiment, the active layer 153 is formed of indium gallium zinc oxide (IGZO) or other transition metal oxide, in order to reduce leakage current.

The source electrode 154 and the drain electrode 155 are disposed in a same layer as the data lines 13, i.e., all of them are located over the layer of the active layer 153 and are formed of the same material which is typically non-transparent metal material or an alloy thereof.

The data line 13 is electrically connected to the source electrode 154.

In the above TFT 15, the gate 151 is disposed in a same layer as the solar cell structure 19. The gate insulating layer 152 is located over the layer of the gate 151 and the solar cell structure 19 to cover the gate 151 and the solar cell structure 19. Such a design facilitates the solar cell structure receiving irradiation of external light so as to improve the utilization ratio of light and the working efficiency of the solar cell structure.

The array substrate further includes a barrier layer 21 disposed over the active layer 153 and below the layer of the source electrode 154 and the drain electrode 155. The barrier layer 21 is configured to protect the active layer 153 from being over-etched. The barrier layer utilizes transparent insulating material, such as silicon oxide or silicon nitride.

The barrier layer 21 is provided with a first via hole 211 and a second via hole 212 at locations corresponding to the source electrode 154 and the drain electrode 155, respectively. The source electrode 154 is electrically connected to the active layer 153 through the first via hole 211, and the drain electrode 155 is electrically connected to the active layer 153 through the second via hole 212.

The barrier layer 21 and the gate insulating layer 152 are provided with a third via hole 213 at a location corresponding to the power output line 20, and the positive electrode 191 is electrically connected to the power output line 20 through the third via hole 213.

The array substrate further includes a passivation layer 22. The passivation layer 22 is disposed over the layer of the source electrode 154 and the drain electrode 155 to cover the area over the TFT 15, and is configured to protect the TFT from being eroded. The passivation layer 22 is provided with a fifth via hole 215 at a location corresponding to the drain electrode 155, and the pixel electrode 17 is electrically connected to the drain electrode 155 through the fifth via hole 215.

Figure 4:
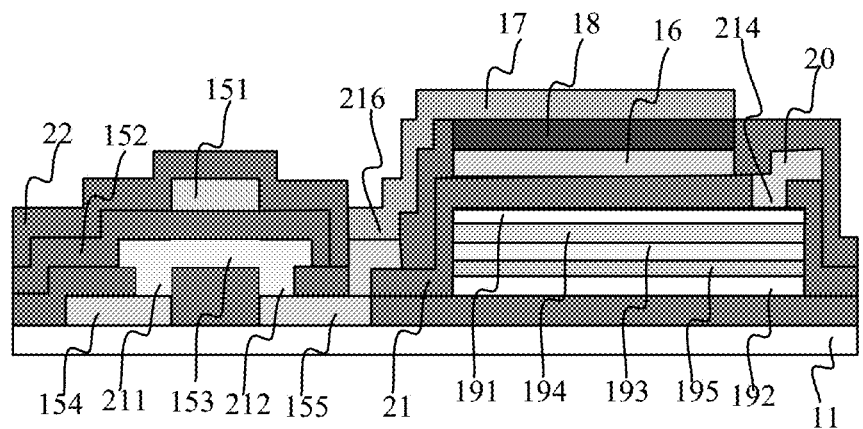
FIG. 4 illustrates a planar schematic structural view of an array substrate as provided by a second embodiment of the present disclosure.

The second embodiment of the present disclosure provides another array substrate. As shown in FIG. 4, the array substrate has a structure substantially same as that of the array substrate as provided by the first embodiment, except that the TFT 15 in the array substrate as provided by the second embodiment is a top gate TFT, and that the solar cell structure 19 is located over the barrier layer 21 and below the gate insulating layer 152 and is disposed in a same layer as the active layer 153.

The source electrode 154 and the drain electrode 155 are located over the substrate 11, and are disposed in a same layer.

The active layer 153 is located over the layer of the source electrode 154 and the drain electrode 155. The active layer 153 is generally formed by using semiconductor material, such as monocrystalline silicon and polycrystalline silicon. Since the active layer 153 is disposed in a same layer as the solar cell structure 19, it is possible to form the active layer and the intrinsic silicon material layer of the solar cell structure through a single patterning process, which facilitates reducing the manufacture steps and reducing the production cost.

The gate insulating layer 152 is located over the active layer 153 to cover the active layer 153 and allow the active layer 153 to be insulated from the gate 151.

The gate 151 is located over the gate insulating layer 152.

The barrier layer 21 is located over the layer of the source electrode 154 and the drain electrode 155 and below the active layer 153, and is configured to protect the source electrode and the drain electrode from being over-etched. The barrier layer 21 is provided with a first via hole 211 and a second via hole 212 at locations corresponding to the source electrode 154 and the drain electrode 155, respectively. The source electrode 154 is electrically connected to the active layer 153 through the first via hole 211, and the drain electrode 155 is electrically connected to the active layer 153 through the second via hole 212.

The barrier layer 21 is provided with a fourth via hole 214 at a location corresponding to the power output line 20, and the positive electrode 191 is electrically connected to the power output line 20 through the fourth via hole 214.

The passivation layer 22 and the barrier layer 21 are provided with a sixth via hole 216 at a location corresponding to the drain electrode 155, and the pixel electrode 17 is electrically connected to the drain electrode 155 through the sixth via hole 216.

The array substrate as provided by the first and second embodiments of the present disclosure includes a light-emitting structure configured to provide a backlight source, a solar cell structure and a power output line. The light-emitting structure is disposed between the common electrode and the pixel electrode; the solar cell structure is disposed between the substrate and the common electrode; the power output line is disposed in a same layer as the common electrode, and is electrically connected to the solar cell structure so as to transmit electric energy generated by the solar cell structure to an external circuit, which achieves a combination of the solar energy technology and the OLED display technology. By means of such a solar cell structure, it can generate electric energy to be transmitted to an external circuit which stores the electric energy as received for supplying the array substrate so that the array substrate can operate without external power supply. In the array substrate above, the power output line and the common electrode are disposed in the same layer, and hence can be formed through a single patterning process, which simplifies the manufacture process, reduces the production cost and also shortens the manufacture period.

The third embodiment of the present disclosure provides a manufacture method of array substrate, including: a step of forming scanning lines, data lines, a common electrode, a pixel electrode and a TFT. The step of forming the TFT includes a step of forming a gate, a gate insulating layer, a source electrode, a drain electrode and an active layer, wherein the common electrode, the pixel electrode and the TFT are all formed in a plurality of pixel regions defined by the scanning lines and the data lines. The method further includes a step of forming a light-emitting structure, a solar cell structure and a power output line over a substrate. The light-emitting structure is disposed between the common electrode and the pixel electrode. The solar cell structure is disposed between the array substrate and the common electrode. The power output line is disposed in a same layer as the common electrode, and is electrically connected to the solar cell structure so as to transmit electric energy generated by the solar cell structure to an external circuit.

By way of example, hereafter the manufacture method of array substrate in practical manufacture process is described in details with reference to the array substrate in the first embodiment, wherein the method includes steps as below.

Figure 5:
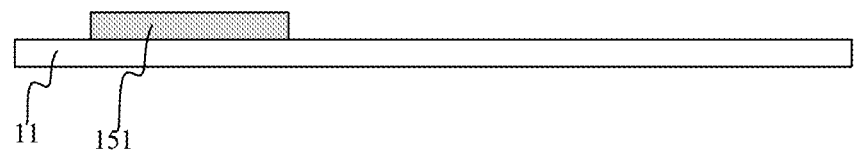
FIGS. 5-12 illustrate a diagram of a manufacture process of the array substrate as provided by the first embodiment of the present disclosure.

In the first step, referring to FIG. 5, depositing a layer of metal film on the substrate 11, and then forming a pattern including the gate 151 by a patterning process. The material forming the metal film is non-transparent metal including Cr, W, Ti, Ta, Mo, Al and Cu, or the like, or an alloy thereof.

Figure 6:
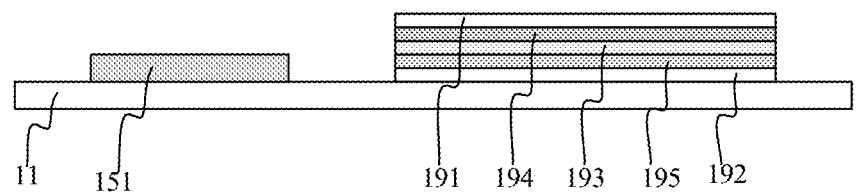

In the second step, referring to FIG. 6, forming a pattern including the solar cell structure 19 over the substrate, wherein the solar cell structure 19 is disposed in a same layer as the gate 151. During forming the solar cell structure 19, depositing a first transparent conductive material layer, a P-type silicon material layer, an intrinsic silicon material layer, a N-type silicon material layer and a second transparent conductive material layer in turn on the substrate 11, and then forming the negative electrode 192, the P-type silicon material layer 194, the intrinsic silicon material layer 193, the N-type silicon material layer 195 and the positive electrode 191 in turn by a patterning process.

Figure 7:
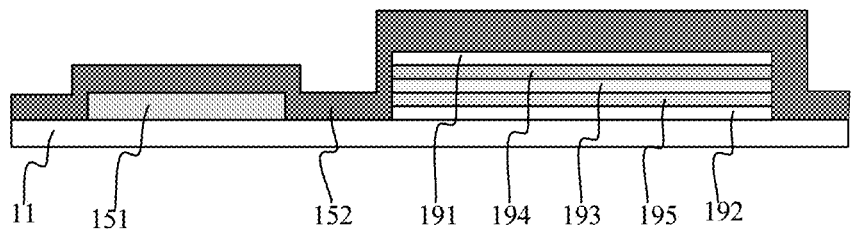

In the third step, referring to FIG. 7, depositing a silicon nitride layer or a silicon oxide layer over the pattern including the solar cell structure 19 to form the gate insulating layer 152.

Figure 8:
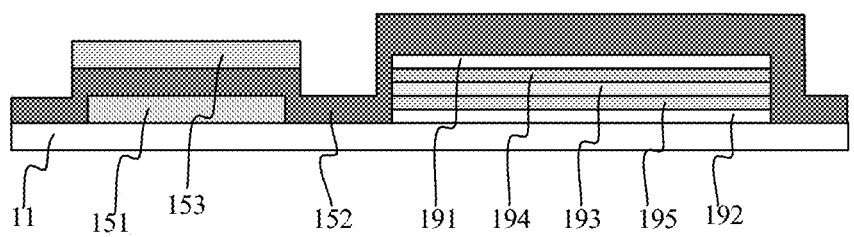

In the fourth step, referring to FIG. 8, depositing semiconductor material over the gate insulating layer 152, and then forming a pattern including the active layer 153 by a patterning process. The semiconductor material can be polycrystalline silicon semiconductor material, amorphous silicon semiconductor material or metal oxide semiconductor material.

Figure 9:
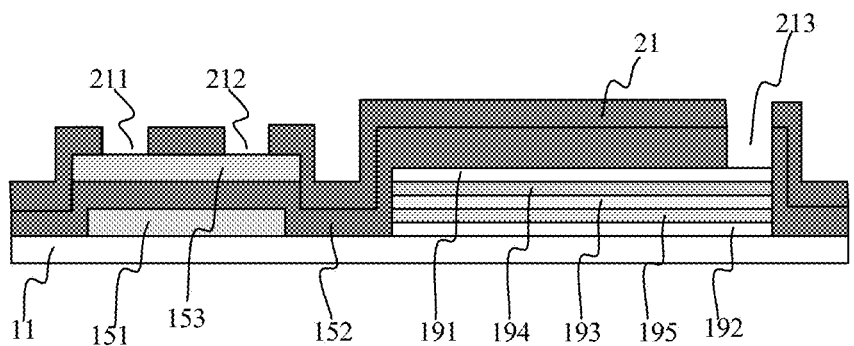

In the fifth step, referring to FIG. 9, depositing a silicon nitride layer or a silicon oxide layer over the pattern including the active layer 153 to form the barrier layer 21; then forming the first via hole 211 and the second via hole 212 at locations in the barrier layer corresponding to the source electrode 154 and the drain electrode 155, respectively, and forming the third via hole 213 at a location in the barrier layer corresponding to the power output line, wherein the third via hole 213 is penetrating through the barrier layer 21 and the gate insulating layer 152.

Figure 10:
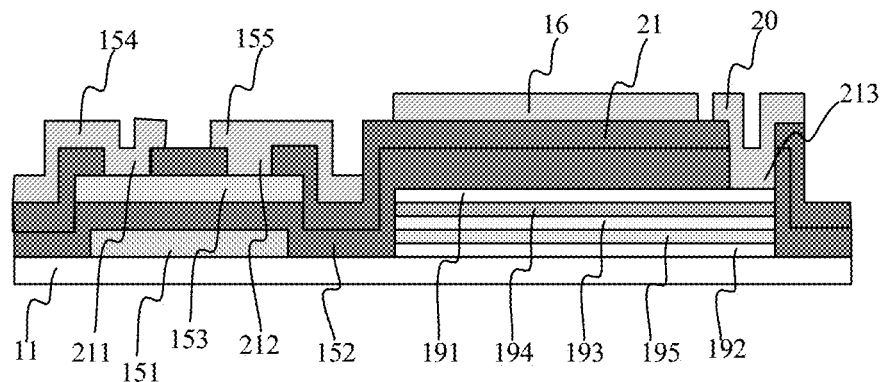

In the sixth step, referring to FIG. 10, depositing a layer of metal film over the barrier layer, and then forming a pattern including the source electrode 154, the drain electrode 155, the common electrode 16 and the power output line 20 by a patterning process. The source electrode 154 is electrically connected to the active layer 153 through the first via hole 211, the drain electrode 155 is electrically connected to the active layer 153 through the second via hole 212, and the power output line 20 is electrically connected to the solar cell structure 19 through the third via hole 213.

Figure 11:
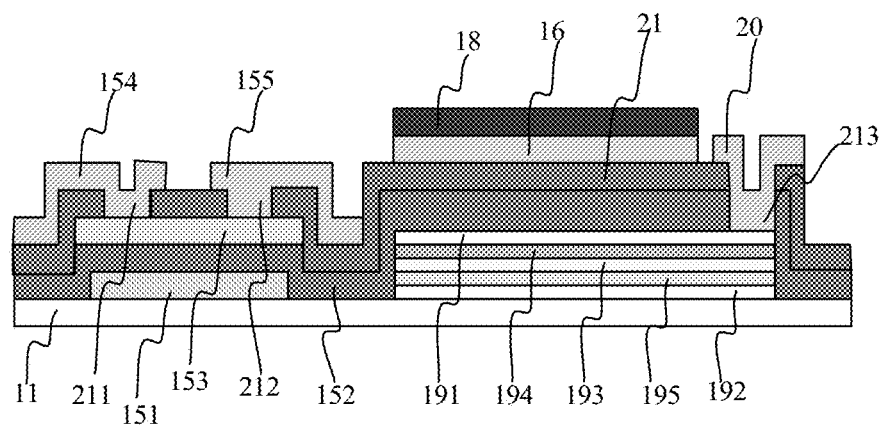

In the seventh step, referring to FIG. 11, forming a pattern including the light-emitting structure 18 over the pattern including the source electrode 154, the drain electrode 155, the common electrode 16 and the power output line 20. Particularly, this step includes coating a light-emitting material layer and a transparent conductive material layer over the pattern including the light-emitting structure 18 formed over the pattern including the source electrode 154, the drain electrode 155, the common electrode 16 and the power output line 20, and then forming the light-emitting material layer and the anode of the light-emitting structure through a patterning process, and the common electrode 16 is configured to serve as the cathode of the light-emitting structure 18.

Figure 12:
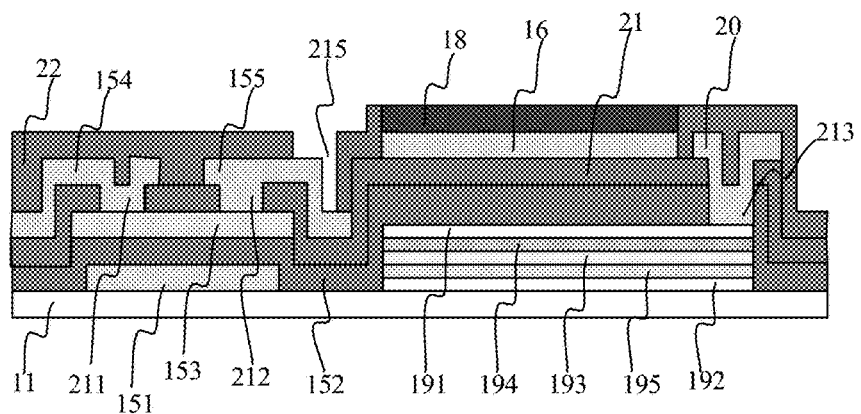

In the eighth step, referring to FIG. 12, depositing a silicon nitride layer or a silicon oxide layer over the TFT to form a passivation layer configured to protect the TFT from being eroded. Forming the fifth via hole 215 in the passivation layer 22 by a patterning process, which penetrates through the passivation layer and corresponds to the location of the drain electrode 155.

In the ninth step, referring to FIG. 2, depositing a layer of indium tin oxide (ITO) transparent conductive film over the passivation layer 22 by using a magnetron sputtering method, and forming a pattern including the pixel electrode 17 by a patterning process; wherein the pixel electrode 17 is electrically connected to the drain electrode 155 through the fifth via hole 215, and the fifth via hole 215 is filled with transparent conductive material configured to form the pixel electrode 17.

Thus, an array substrate as provided by the first embodiment of the present disclosure having a sectional structure as shown in FIG. 2 is formed by the steps above.

It should be noted that it is also possible to form the pattern including the pixel electrode 17 firstly and then forming the passivation layer 22, during the above manufacture process of array substrate.

For the array substrate as provided by the second embodiment of the present disclosure, the manufacture method thereof is similar as that of the array substrate as provided by the first embodiment and includes steps as below.

Figure 13:
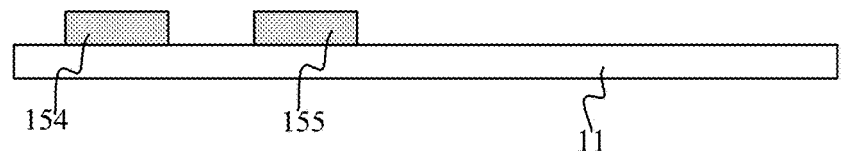
FIGS. 13-23 illustrate a diagram of a manufacture process of the array substrate as provided by the second embodiment of the present disclosure.

In the first step, referring to FIG. 13, depositing a layer of metal film on the substrate 11, and then forming a pattern including the source electrode 154 and the drain electrode 155 by a patterning process. The material forming the metal film includes non-transparent metal, such as Cr, W, Ti, Ta, Mo, Al and Cu, or the like, or an alloy thereof.

Figure 14:
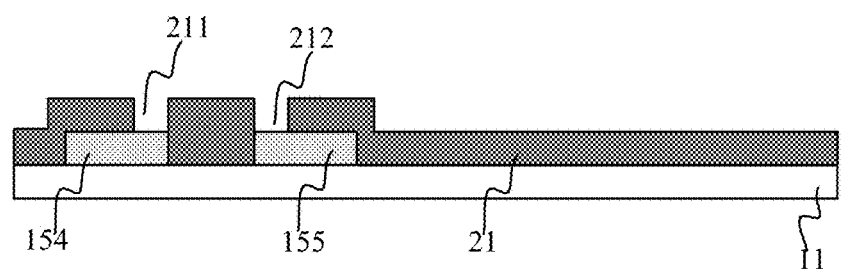

In the second step, referring to FIG. 14, depositing a silicon nitride layer or a silicon oxide layer over the pattern including the source electrode 154 and the drain electrode 155 to form the barrier layer 21; and then forming the first via hole 211 and the second via hole 212 at locations in the barrier layer corresponding to the source electrode 154 and the drain electrode 155, respectively; the active layer 153 is electrically connected to the source electrode 154 through the first via hole 211, and is electrically connected to the drain electrode 155 through the second via hole 212.

Figure 15:
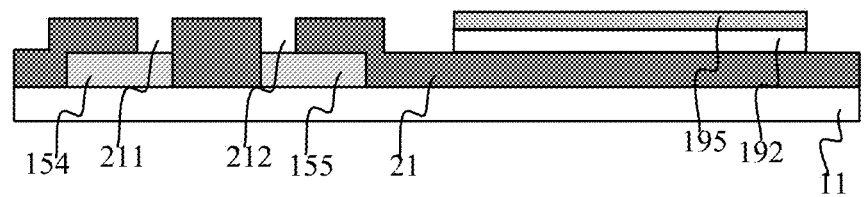

In the third step, referring to FIG. 15, depositing transparent conductive material and N-type silicon material in turn over the barrier layer 21; and then forming a pattern including the negative electrode 192 and the N-type silicon material layer 192 of the solar cell structure by a patterning process.

Figure 16:
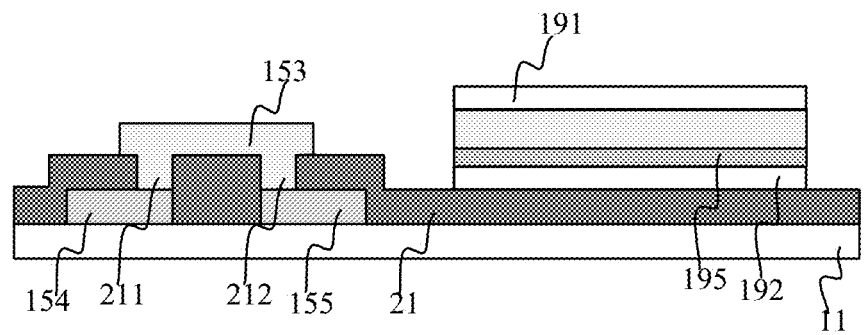

In the fourth step, referring to FIG. 16, depositing intrinsic Si material over the pattern including the N-type silicon material layer of the solar cell structure 19; and then forming a pattern including the active layer 153 and the intrinsic Si material layer of the solar cell structure 19 by a patterning process, and depositing a layer of metal film over the intrinsic Si material layer to form the positive electrode 191 of the solar cell structure.

Figure 17:
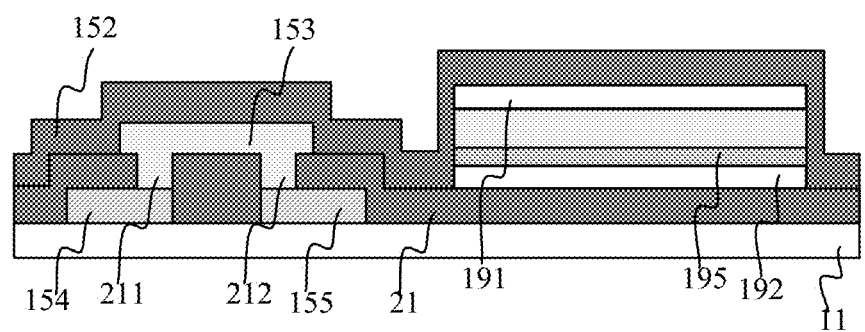

In the fifth step, referring to FIG. 17, depositing a silicon nitride layer or a silicon oxide layer over the pattern including the active layer 153 and the intrinsic Si material layer of the solar cell structure 19 to form a gate insulating layer 152.

Figure 18:
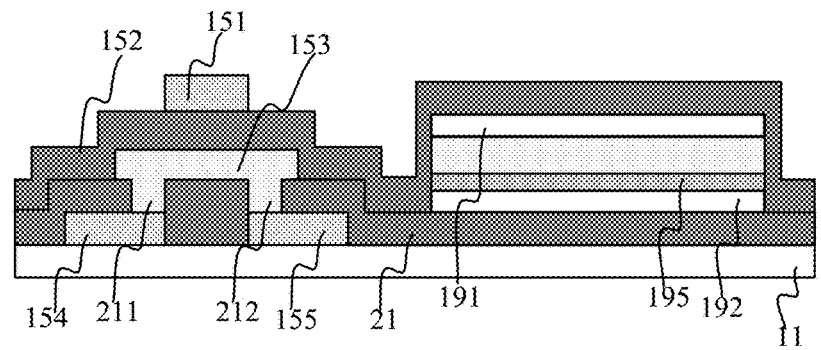

In the sixth step, referring to FIG. 18, depositing a layer of metal film over the gate insulating layer 152, and then forming a pattern including the gate 151 by a patterning process. The material forming the metal film includes non-transparent metal, such as Cr, W, Ti, Ta, Mo, Al and Cu, or the like or an alloy thereof.

Figure 19:
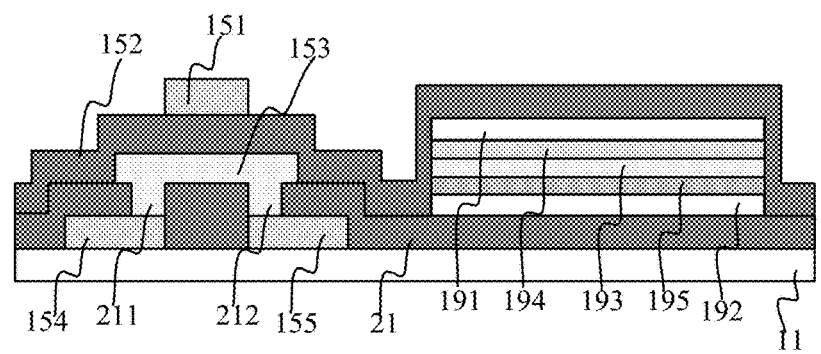

In the seventh step, referring to FIG. 19, doping the active layer with $PH_3$ at locations corresponding to the source electrode and the drain electrode by way of iron injection to increase the carrier concentration; and doping the intrinsic Si material in the solar cell structure 19 to form the intrinsic Si material layer 193 and the P-type silicon material layer 194 of the solar cell structure 19.

Figure 20:
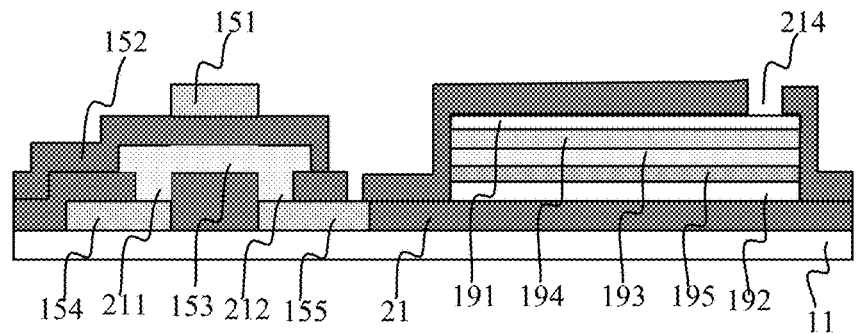

In the eighth step, referring to FIG. 20, forming the fourth via hole 214 in the gate insulating layer 152 at a location corresponding to the power output line 20 by a patterning process, wherein the power output line 20 is electrically connected to the solar cell structure 19 through the fourth via hole 214; and forming a via hole in the gate insulating layer 152 and the barrier layer 21 at a location corresponding to the drain electrode 155.

Figure 21:
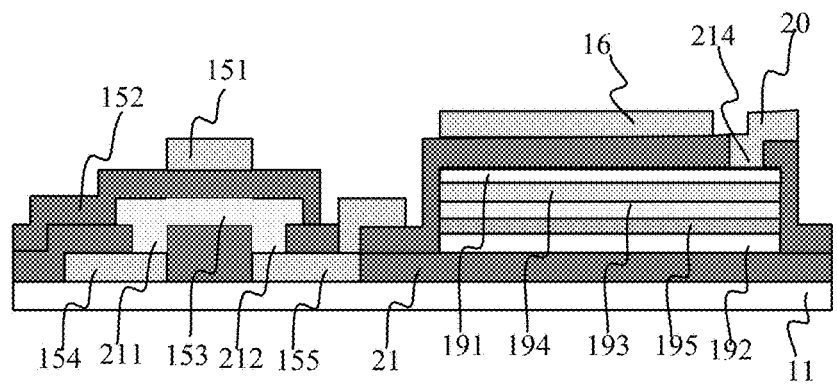

In the ninth step, referring to FIG. 21, depositing a layer of metal film over the pattern including the gate 151, and forming a pattern including the common electrode 16 and the power output line 20 by a patterning process.

Figure 22:
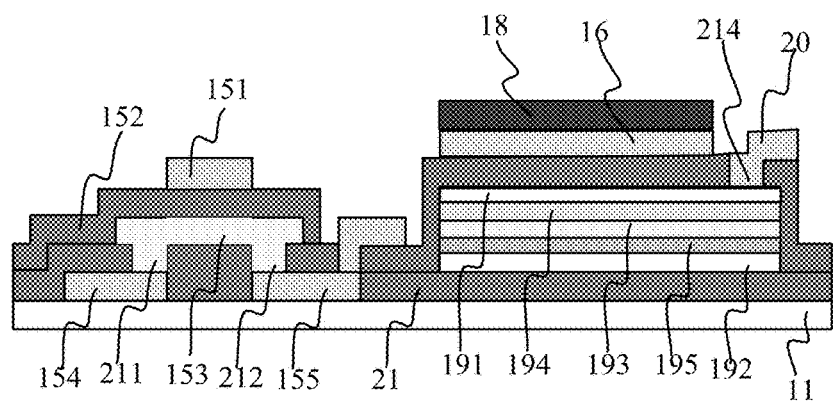

In the tenth step, referring to FIG. 22, forming a pattern including the light-emitting structure 18 over the pattern including the common electrode 16 and the power output line 20; during forming the pattern including the light-emitting structure 18, depositing a light-emitting material layer and a transparent conductive material layer over the pattern including the common electrode 16 and the power output line 20, and then forming the light-emitting layer and the anode of the light-emitting structure by a patterning process; the common electrode 16 is configured to serve as the cathode of the light-emitting structure 18.

Figure 23:
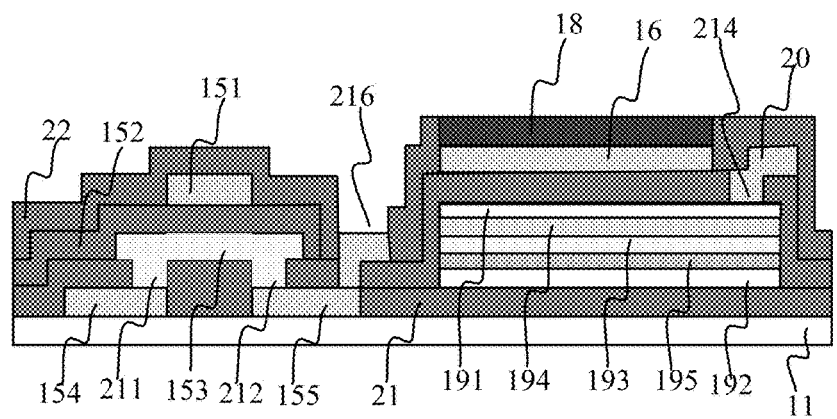

In the eleventh step, referring to FIG. 23, depositing transparent insulating material including silicon nitride or silicon oxide, or the like, over the pattern including the light-emitting structure 18 to form the passivation layer 22; and forming a via hole penetrating through the passivation layer, in the gate insulating layer 152 and in the barrier layer 21 at a location corresponding to the drain electrode 155, that is, forming the sixth via hole 216 penetrating through the passivation layer 22, the gate insulating layer 152 and the barrier layer 21.

In the twelfth step, referring to FIG. 4, depositing a layer of indium tin oxide (ITO) transparent conductive film over the passivation layer 22 by using a magnetron sputtering method, and forming a pattern including the pixel electrode 17 by a patterning process; wherein the pixel electrode 17 is electrically connected to the drain electrode 155 through the sixth via hole 216, and the sixth via hole 216 is filled with metal conductive material configured to form the common electrode and transparent conductive material configured to form the pixel electrode.

Thus, an array substrate as provided by the second embodiment of the present disclosure having a sectional structure as shown in FIG. 4 is formed by the steps above.

Embodiments of the present disclosure also provide a display panel including any of the array substrates above. The solar cell structure is located on the substrate and is convenient to receive irradiation of external light so as to improve the utilization ratio of light and the working efficiency of the solar cell structure.

As above, embodiments of the present disclosure provide an array substrate, a manufacture method of the same and a display panel. The array substrate includes a light-emitting structure, a solar cell structure and a power output line. The light-emitting structure is disposed between the common electrode and the pixel electrode. The solar cell structure is disposed between the substrate and the common electrode. The power output line is disposed in a same layer as the common electrode and is electrically connected to the solar cell structure so as to transmit electric energy generated by the solar cell structure to an external circuit, which achieves a combination of the solar energy technology and the OLED display technology. By means of the solar cell structure, it can generate electric energy to be transferred to an external circuit which stores the electric energy as received for supplying the array substrate so that the array substrate can operate without external power supply. Furthermore, in the array substrate above, the power output line and the common electrode are disposed in A same layer, and hence can be formed through a single patterning process, which simplifies the manufacture process, reduces the production cost and shortens the manufacture period.

It is understood that the described above are just exemplary embodiments to explain the present disclosure and the invention is not intended to limit thereto. An ordinary person in the art can make various variations and modifications to the present disclosure without departure from the spirit and the scope of the present invention, and such variations and modifications as well as equivalent solutions shall fall in the scope of the present invention. The protection scope of the present invention is defined by the claims.

The present application claims the priority of Chinese patent application No. 201410130738.X, titled "AN ARRAY SUBSTRATE AND A MANUFACTURE METHOD THEREOF, DISPLAY PANEL", filed on Mar. 28, 2014, which is incorporated herein by reference in its entirely.

What is claimed is:

1. An array substrate, comprising:
    a substrate;
    scanning lines and data lines arranged in an intersecting manner on the substrate;
    pixel units defined by the scanning lines and the data lines and arranged in matrix, wherein each of the pixel units is provided with a thin film transistor (TFT), a common electrode and a pixel electrode therein, and the TFT comprises a gate, a gate insulating layer, an active layer, a source electrode and a drain electrode;
    a light-emitting structure configured to provide a backlight source, a solar cell structure, and a power output line;
    a barrier layer provided over the active layer and below a layer of the source electrode and the drain electrode, wherein,
    the light-emitting structure is provided between the common electrode and the pixel electrode;
    the solar cell structure is provided between the substrate and the common electrode and comprises a positive electrode and a negative electrode disposed oppositely to each other;
    the power output line is provided in a same layer as the common electrode and is electrically connected to the solar cell structure so as to transmit electric energy generated by the solar cell structure to an external circuit;
    the barrier layer is provided with a first via hole and a second via hole at locations corresponding to the source electrode and the drain electrode, respectively; the source electrode is electrically connected to the active layer through the first via hole, and the drain electrode is electrically connected to the active layer through the second via hole; and
    the barrier layer and the gate insulating layer are provided with a third via hole at a location corresponding to the power output line, and the positive electrode is electrically connected to the power output line through the third via hole.

2. The array substrate according to claim 1, wherein the light-emitting structure comprises:
    an anode and a cathode provided oppositely to each other; and
    a light-emitting material layer provided between the anode and the cathode, wherein the common electrode located below the light-emitting structure serves as the cathode.

3. The array substrate according to claim 1, wherein the TFT is a bottom gate TFT; the gate is provided in a same layer as the solar cell structure; and the gate insulating layer is located over a layer of the gate and the solar cell structure located to cover the gate and the solar cell structure.

4. The array substrate according to claim 1, wherein
    the barrier layer is provided with a fourth via hole at a location corresponding to the power output line, and the positive electrode is electrically connected to the power output line through the fourth via hole.

5. The array substrate according to claim 1, further comprising a passivation layer located over the TFT.

6. A display panel, comprising the array substrate of claim 1.

7. The array substrate according to claim 1, wherein the solar cell structure comprises: the positive electrode and the negative electrode disposed oppositely to each other; an intrinsic silicon material layer disposed between the positive electrode and the negative electrode; a P-type silicon material layer disposed between the positive electrode and the intrinsic silicon material layer; and a N-type silicon material layer disposed between the negative electrode and the intrinsic silicon material layer.

8. The array substrate according to claim 1, wherein the TFT is a top gate TFT; and the active layer is provided in a same layer as the solar cell structure.

9. The array substrate according to claim 8, wherein the solar cell structure comprises: the positive electrode and the negative electrode disposed oppositely to each other; an intrinsic silicon material layer disposed between the positive electrode and the negative electrode; a P-type silicon material layer disposed between the positive electrode and the intrinsic silicon material layer; and a N-type silicon material layer disposed between the negative electrode and the intrinsic silicon material layer.

10. A manufacture method of an array substrate, comprising:
    forming scanning lines, data lines, a common electrode, a pixel electrode and a thin film transistor (TFT); wherein the TFT comprises a gate, a gate insulating layer, a source electrode, a drain electrode and an active layer, and wherein the common electrode, the pixel electrode and the TFT are all formed in a plurality of pixel regions defined by the scanning lines and the data lines; and
    forming a light-emitting structure configured to provide a backlight source, a solar cell structure and a power output line over a substrate; and
    forming a barrier layer over a pattern comprising the active layer, the barrier layer being located below a layer of the source electrode and the drain electrode;
    wherein,
    the light-emitting structure is provided between the common electrode and the pixel electrode;
    the solar cell structure is provided between the array substrate and the common electrode; and
    the power output line is provided in a same layer as the common electrode, and is electrically connected to the solar cell structure so as to transmit electric power generated by the solar cell structure to an external circuit.

11. The method according to claim 10, wherein the light-emitting structure comprises:
    an anode and a cathode provided oppositely to each other; and
    a light-emitting material layer provided between the anode and the cathode, wherein the common electrode located below the light-emitting structure serves as the cathode.

12. The method according to claim 10, wherein forming of the TFT comprises:
    forming a pattern comprising the gate over the substrate, the gate is provided in a same layer as the solar cell structure;
    forming the gate insulating layer over the pattern comprising the gate, wherein the gate insulating layer is located over the gate and the solar cell structure to completely cover the gate and the solar cell structure;
    forming a pattern comprising the active layer over the gate insulating layer; and
    forming the source electrode and the drain electrode over the pattern comprising the active layer, the source electrode and the drain electrode are provided in a same layer.

13. The method according to claim 10, wherein forming the TFT comprises:
    forming a pattern comprising the gate over the substrate, the gate is provided in a same layer as the solar cell structure;
    forming the gate insulating layer over the pattern comprising the gate, wherein the gate insulating layer is located over the gate and the solar cell structure to completely cover the gate and the solar cell structure;
    forming a pattern comprising the active layer over the gate insulating layer; and
    forming the source electrode and the drain electrode over the pattern comprising the active layer, the source electrode and the drain electrode are provided in a same layer.

14. A manufacture method of array substrate, comprising:
    forming scanning lines, data lines, a common electrode, a pixel electrode and a thin film transistor (TFT) on a substrate;
    wherein forming of the TFT comprises:
        forming a pattern comprising a source electrode and a drain electrode over the substrate, the source electrode and the drain electrode are provided in a same layer;
        forming a pattern comprising an active layer over the pattern comprising the source electrode and the drain electrode, the active layer is located below a gate insulating layer;
        forming the gate insulating layer over the pattern comprising the active layer, the gate insulating layer is located below the gate; and
        forming a pattern comprising a gate over the gate insulating layer;
    wherein the common electrode, the pixel electrode and the TFT are all formed in a plurality of pixel regions defined by the scanning lines and the data lines;
    forming a light-emitting structure to provide a backlight source, a solar cell structure and a power output line over the substrate; and
    forming a barrier layer over the pattern comprising the gate, the barrier layer being located over the layer of the source electrode and the drain electrode and below the active layer.

15. The method according to claim 14, further comprising:
    forming a passivation layer over the TFT.

* * * * *